United States Patent [19]

Jayant et al.

[11] Patent Number: 5,136,374
[45] Date of Patent: Aug. 4, 1992

[54] GEOMETRIC VECTOR QUANTIZATION

[75] Inventors: Nuggehally S. Jayant, Gillette; Christine I. Podilchuk, North Brunswick, both of N.J.

[73] Assignee: AT&T Bell Laboratories, Murray Hill, N.J.

[21] Appl. No.: 503,659

[22] Filed: Apr. 3, 1990

[51] Int. Cl.⁵ .............................................. H04N 7/13
[52] U.S. Cl. ...................................... 358/133; 358/136
[58] Field of Search ............... 358/133, 135, 136, 426, 358/433; 375/27, 122; 341/106; 382/56; 381/29-31

[56] References Cited

U.S. PATENT DOCUMENTS

| | | | |
|---|---|---|---|
| 4,769,826 | 9/1988 | Kubo et al. | 358/136 X |
| 4,780,761 | 10/1988 | Daly et al. | 358/133 |
| 4,797,739 | 1/1989 | Tanaka | 358/433 X |
| 5,010,401 | 4/1991 | Murakami et al. | 358/133 X |

*Primary Examiner*—Victor R. Kostak
*Attorney, Agent, or Firm*—W. Ryan; T. A. Restaino

[57] ABSTRACT

A geometric vector quantizer coding technique is illustrated in the context of a full motion video coder based on a three-dimensional sub-band framework. The original image data is decomposed into different spatial-temporal frequency bands and based on the data in each, different quantization strategies are applied to the bands. The lowest spatial-temporal frequency band is coded using a traditional three-dimensional switched predictor and optimum scaler quantizer. The non-dominant sub-bands are coded using the vector quantization approach to efficiently encode the images while appropriately exploiting the sparse, highly structured nature of the data to design the codebooks. Variable resolution is achieved using these techniques and no training is needed to establish or maintain the codebook.

14 Claims, 4 Drawing Sheets

GEOMETRIC VECTOR QUANTIZATION

FIELD OF THE INVENTION

This invention relates to the efficient digital coding of multi-valued signals and, more particularly, to the digital coding of high quality audio, video and other signals at low bit rates. However, the present invention will be described in illustrative embodiments in the context of coding of images such as video signals.

BACKGROUND OF THE INVENTION

Good quality, low bit rate video coding is required for such applications as teleconferencing over existing and future networks, including ISDN. An effective low bit rate coder should remove the redundancy due to spatial and temporal correlations along with the perceptually irrelevant components of an image sequence. One very effective coder for still image compression (described in U.S. patent application Ser. No. 07/350435 by J. D. Johnston and R. J. Safranek, entitled "Perceptually-Tuned Sub-band Image Coder," filed May 4, 1989, and in R. J. Safranek and J. D. Johnston, "A Perceptually Tuned Sub-band Image Coder With Dependent Quantization and Post Quantization," *Proc. ICASSP*, 1989) which incorporates statistical as well as perceptual criteria into the coding strategy. However, good quality full motion video coding at low bit rates (e.g., 384 kbps or less) has remained an elusive problem.

Sub-band digital coding techniques are well-known in the art. See, e.g., N. S. Jayant and P. Noll, *Digital Coding of Waveforms: Principles and Applications to Speech and Video*, Prentice Hall, 1984.

Sub-band coding techniques have been used for image coding as described in G. Karlsson and M. Vetterli, "Three Dimensional Sub-band Coding of Video," *Proc. IEEE ICASSP*, 1988, 1100–1103. The techniques described there employ multi-dimensional filtering to generate spatial-temporal sub-bands using so-called quadrature mirror filters. These latter filters are described, e.g., in J. D. Johnston, "A Filter Family Designed for Use in Quandrature Mirror Filter Bands," *Proc. IEEE ICASSP*, 1980, and in the Jayant and Noll book, supra, chapter 11.

Another technique for encoding images is described in D. Chen and A. C. Bovik, "Fast Image Coding Using Simple Image Patterns," SPIE, vol. 1199, Visual Communications and Image Processing IV (1989), pp. 1462–1471. The techniques described in the Chen and Bovik paper use a small number of local patterns as subimages, the selection of such patterns being based on measured properties of biological vision systems and a viewing geometry model. The selection of patterns (subimages) to represent an image is not based on typical error criteria such as the minimum mean square error metric.

A generally useful coding technique used to reduce required bitrates is known as vector quantization. See, e.g., Jayant and Noll, supra, chapter 9, and A. Gersho, "On the Structure of Vector Quantization," *IEEE Trans. Info. Theory*, vol. IT-28, pp. 157–165, March, 1982. Such techniques compare an input sequence to be coded to "vectors" stored in an ordered list or codebook. When the best match (in accordance with some predetermined criterion) is found in the codebook, the index for that vector is selected to represent the input sequence. Generally, some training operation is employed to generate the codebook and to update it over time.

SUMMARY OF THE INVENTION

The present invention extends and simplifies the general class of vector quantization techniques by providing low-bit-rate coding for a variety of signals, including audio, video, geophysical and other signals. An important advantage of the present technique is that it requires no training to generate and maintain a vector codebook for important applications.

The codebook is advantageously chosen as a set of geometric patterns appropriate to the application. Thresholding techniques prove useful in allowing the use of a reference or "null" vector to be selected when the significance of a subset of input signals falls below a predetermined threshold. It proves convenient to use well-known Huffman coding techniques to represent the code vectors and associated magnitude information, with frequently occurring vectors being represented by short code sequences. Thus variable resolution coding is achieved and the number of bits needed to represent the input sequence is significantly reduced, especially when the input is "sparse" in significant portions. An example of such sparse inputs is image information in which a background is essentially constant over substantial parts of the image.

The present invention will be described in greater detail in connection with a new system and method of low bit rate video encoding which employs a three-dimensional sub-band scheme. Illustratively, an image sequence is separated into different spatial-temporal frequency bands, using ten-tap one-dimensional quadrature mirror filters (qmfs) of the type described in J. D. Johnston, "A Filter Family Designed For Use in Quadrature Mirror Filter Banks," *Proceedings IEEE ICASSP*, 1980. The sub-band which contains the lowest spatial-temporal frequency components is coded with high quality, typically using a standard ADPCM code, while the non-dominant sub-bands are quantized using a low bit rate vector quantization (VQ) method incorporating a new structured codebook in accordance with one aspect of the present invention.

Perceptually irrelevant sub-bands (which typically comprise the highest temporal and spatial frequency components) are advantageously not coded.

The other non-dominant sub-bands are the high frequency sub-bands which have relatively low energy content, but which contain perceptually significant data in the form of edge information and other high frequency details. This information appears in a very structured form within each sub-band and each sub-band advantageously has a structure associated with it relating to its spatial-temporal frequency location. These sub-bands are coded at a much lower bit rate than the dominant low frequency sub-band using the vector quantizing techniques of the present invention.

DETAILED DESCRIPTION

As noted above, the field of sub-band coding is well developed. Reference is made to the book by Jayant and Noll, especially chapter 11, for much background information and prior art techniques. Likewise, the above cited patent application by Johnston and Safranek is useful in this regard and is, accordingly, incorporated by reference and considered to be a part of the present description.

FIGS. 1(a) and 1(b), based generally on FIG. 11.1 of the cited Jayant and Noll book, show the overall framework for an image coder and decoder, respectively, illustrating use of the present invention.

Also treated generally in the Jayant and Noll book are so-called quadrature mirror filter bank techniques. These techniques are adapted in some aspects for use in the present invention. Thus Jayant and Noll, in FIG. 11.6 show a system for quadrature "mirror" filtering used to split an input sequence of samples into two equal-width sub-bands. This and related filtering techniques are described in Section 11.4 of the Jayant and Noll book. Also see Y. Linde, A. Buzo, and R. M. Gray, "An Algorithm For Vector Quantizer Design," *IEEE Transactions on Communications*, COM-28, pp. 84-95, January 1980.

Figure 1:
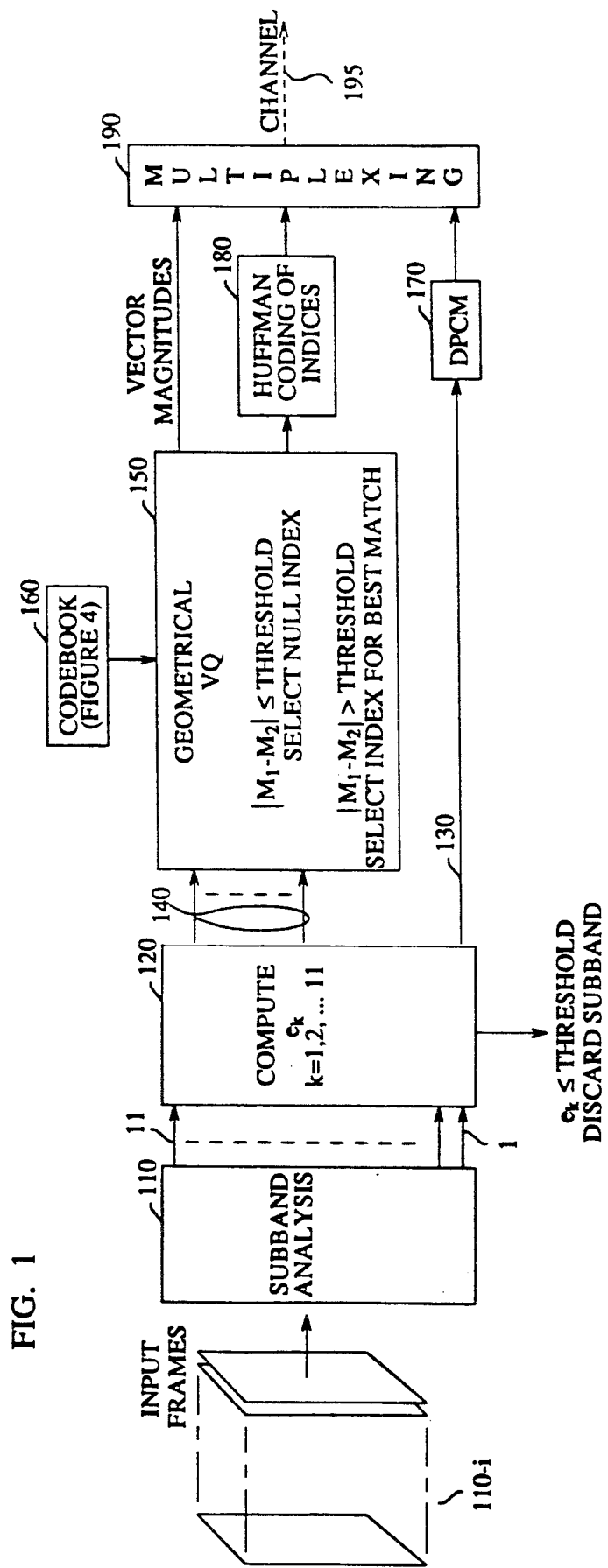
FIGS. 1 and 2 show an overall block diagram of a digital image coder and decoder, respectively, employing the present invention.
Figure 2:
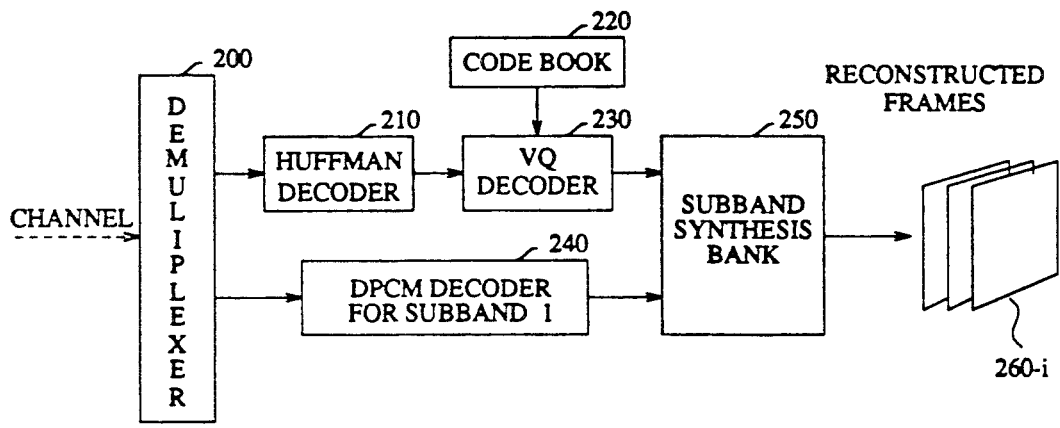

FIG. 1 shows an image encoder which advantageously employs the geometric vector quantizer of the present invention. Correspondingly, FIG. 2 shows an image decoder based on these same inventive techniques. Each of these system elements will now be described individually.

FIG. 1 shows a representation of a graphical image, e.g., sequential frames of a video image, 100-i. Since the sub-band filtering used in this illustrative image coding application advantageously uses 10 taps, it proves convenient to store ten successive frames of the input signal. As a specific example, each frame may contain 288×360 pixels. For present purposes, the image will be considered to be a multi-level image having up to 256 possible intensity levels. Color images are, of course, amenable to coding using the present inventive techniques, but discussion of these application will be deferred.

The successive frames of video information are applied to the sub-band analysis block 110 (described in greater detail in connection with FIG. 3) in FIG. 1 (typically at a rate of 30 frames per second) there, spatial-temporal components are generated and applied to an energy measuring block 120. As noted earlier, the image is separated into 11 spatial-temporal sub-bands; the energy in each of these bands is separately determined as will be shown in more detail in connection with the discussion of FIG. 3.

Figure 3:
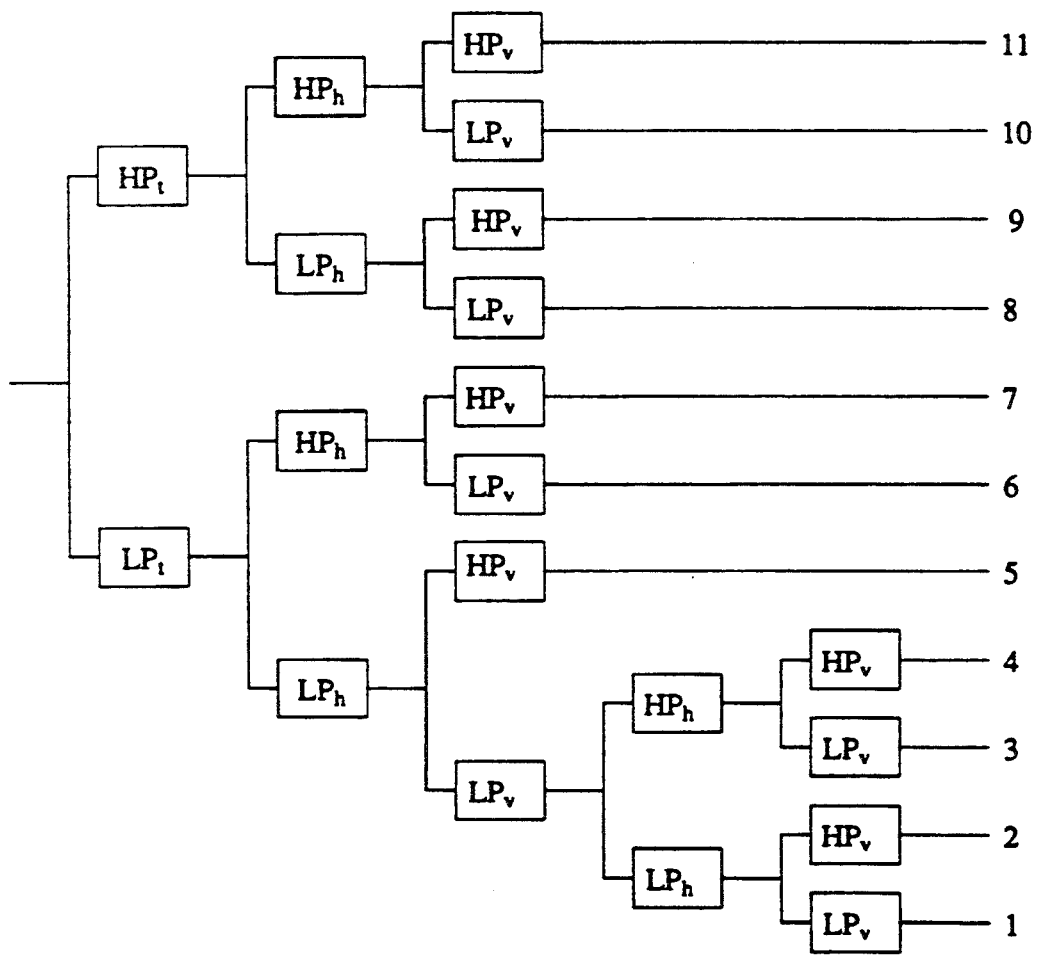
FIG. 3 shows a typical sub-band filter arrangement in accordance with one aspect of the present invention.

In a typical embodiment of the present invention, the sub-band framework illustratively used consists of 11 temporal-spatial frequency bands as shown in FIG. 3. Except for the particular choice of sub-band filters, this is the same basic structure as used in G. Karlsson and M. Vetterli, "Three Dimensional Sub-band Coding of Video," *Proc. ICASSP*, 1988. The terms HP and LP refer to high-pass filtering and low-pass filtering respectively while the subscripts t, h, and v refer to temporal, horizontal and vertical filtering respectively. The sub-bands whose energy falls below an empirically derived threshold value are discarded without causing severe degradation in the reconstructed image sequence. The remaining sub-bands are coded using a predictive coder and optimum scalar quantizer, as will now be described in greater detail.

Because many applications, such as the presently considered image coding application, may include signal components having negligible components, it proves useful to apply an energy threshold test to the individual components as indicated in block 120 in FIG. 1. In the case of the system of FIG. 1, the energy output for each spatial-temporal sub-band is compared with a previously determined threshold. It proves convenient to calculate the energy in the currently considered example by $$e_k = \sum_{i,j} x_{k,i,j}^2, \text{ for } k = 1,2,\ldots,11,$$

where $x_{k,i,j}$ is the intensity at the ith row, jth column in sub-band k. If the energy in a sub-band is below the threshold, then no further coding of that sub-band is performed for the current time frame.

While the threshold levels can be different for each sub-band, it proves convenient to select a fixed threshold for use with all (or most all) sub-bands in many cases. Thus, for example, when the range of values of intensity for the multi-level signals (pixels in the image coding system of FIG. 1) is $(-128, 128)$, a useful threshold value is chosen as 20 for all components (sub-bands).

Because the lowest spatial-temporal sub-band includes much of the basic image structure of the image, the energy level for that sub-band is generally well in excess of the threshold. In fact, for the presently considered application, it proves advantageous to code this lowest spatial-temporal side-band using a high quality DPCM coder 170 in FIG. 1. Such a coder is described in considerable detail in the above-cited Jayant and Noll book in chapter 6 and will not be elaborated on here, except in one regard.

That is, because the filtering used in the system in FIG. 1 involves both spatial and temporal contributions, it proves convenient to have the predictor used in the otherwise standard DPCM coder be switchable to be either purely spatial predictor or a spatial-temporal predictor. More particularly, the predictive coding strategy is a three-dimensional switched predictor where for each sub-band we predict the current data point $x_{i,j,t}$ by $$\hat{x}_{i,j,t} = \begin{cases} a_1\hat{x}_{i,j-1,t} + a_2\hat{x}_{i-1,j,t} + a_3\hat{x}_{i,j,t-1} & e_n \leq T_1 \\ b_1\hat{x}_{i,j-1,t} + b_2\hat{x}_{i-1,j,t} + b_3\hat{x}_{i-1,j-1,t}e_n > T_1 \end{cases} \quad (1)$$

where $$e_n = \frac{1}{n \cdot n} \sum_{i=1}^{n} \sum_{j=1}^{n} e_{i,j,t}^2 \quad (2)$$

and $$e_{i,j,t} = x_{i,j,t} - \hat{x}_{i,j,t}. \quad (3)$$

As before, term $x_{i,j,t}$ represents the intensity of a scene at the ith line, jth column and the tth frame and $\hat{x}_{i,j,t}$ is the predicted intensity of $x_{i,j,t}$. The optimum predictor coefficients $a = \{a_1, a_2, a_3\}$ for the spatial-temporal predictor and $b = \{b_1, b_2, b_3\}$ for the spatial predictor are computed for each sub-band at every frame in time in standard fashion, as taught in the prior art.

The empirically derived threshold value $T_1$ determines whether the prediction is spatial-temporal or purely spatial. For sub-band pixel intensities in the range ($-128,128$,) a good value for $T_1$ has been found to be 10.

The error signal is coded using a Max quantizer based on a Laplacian pdf described, e.g., in the above-cited Jayant and Noll book.

For typical image sequences and bit rates described, it often occurs that less than all sub-bands need be encoded. For example, only bands 1–4 and band 8 need be coded in many cases. The rest of the sub-bands have very little signal energy and can be discarded. Sub-band 8, corresponding to the low spatial-high temporal frequency band acts as a motion detector in that when an object moves in the original image sequence, the edges of the object appear in this sub-band. By carefully coding this sub-band along with the low spatial-low temporal frequency bands 1–4, good coding results are obtained.

Figure 4:
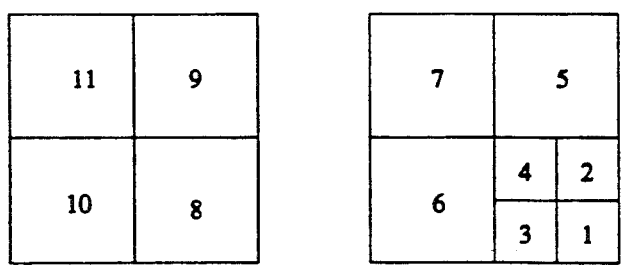
FIG. 4 shows a convenient labeling of the sub-bands for the filter of FIG. 2.

FIG. 4 shows a convenient organization of the outputs of the 11-band frequency decomposition accomplished by the filter in FIG. 3 for a typical image sequence under consideration. When appropriately scaled, the data in the respective sub-bands can be viewed using standard video systems. The right half of FIG. 3, bands 1-7, corresponds to the low temporal frequency band whereas the left half of the figure, bands 8-11, corresponds to the high temporal frequency band. Within each temporal band, the lowest right corner corresponds to the lowest spatial frequency band labeled as sub-band 1 and sub-band 8 while the upper left corner corresponds to the highest spatial frequency band labeled as sub-band 7 and sub-band 11. The data in each band can be conveniently rescaled for display purposes to be compared to the energy levels in the various sub-bands. Sub-band 1, will usually be seen to have a high energy level compared to other sub-bands; this verifies that many of the high frequency sub-bands do not need to be coded. Sub-band 8 acting as a motion detector shows the edges of the images which are moving in the original image sequence.

The data in bands 2-11 is highly structured and each spatial-temporal frequency location has a characteristic structure associated with its frequency content. For example, sub-band 2 corresponding to high vertical-low horizontal spatial frequency components consists of mostly horizontal strips while sub-band 3 corresponding to low vertical-high horizontal spatial frequency components consists of mostly vertical strips. The data in sub-band 1 indicates where the edges are located; thus indicating where the data should appear in the higher frequency bands.

VECTOR QUANTIZATION

The remainder of the system of FIG. 1 relates to the vector quantization of information signals, illustratively the video image signals 100-i that have been filtered and have found to be in sub-bands having sufficient energy to warrant further coding.

Figure 5:
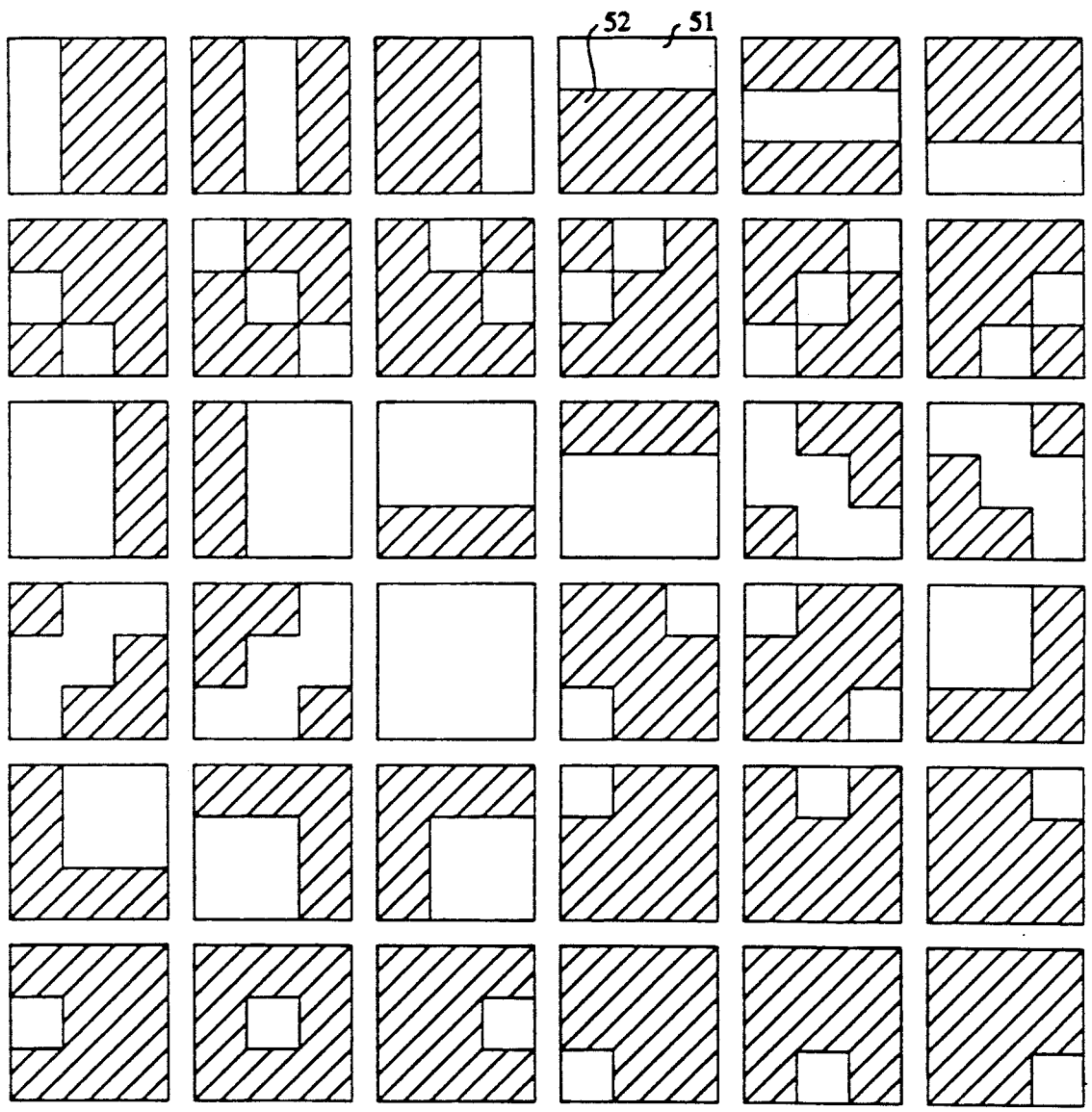
FIG. 5 is a typical code book of geometric vectors used in coding information including the sub-band signals used in the system of FIGS. 1-3.

The vector quantization in accordance with the present invention, in common with other such techniques, employs a codebook 160 shown in FIG. 1 and, more particularly, in FIG. 5. The codebook vectors in the illustrative codebook of FIG. 5 are 36 in number and represent for the present video processing application, two-dimensional patterns to be matched with corresponding areas of the image sub-band patterns.

While the particular code vectors illustrated in FIG. 5 prove useful in the present illustrative application, it should be understood that other applications may profit from the use of linear array patterns of varying length, or by any arbitrary patterns suitable to the application. Thus if speech information signals are to be processed, it might prove convenient to use a variety of linear patterns for the vectors, while an application relating to facsimile signals may profit from the use of patterns relating to two-dimensional arrays perhaps including alpha-numeric character patterns.

While the codebook vectors shown in FIG. 5 are shown as elements in a $3 \times 3$ array, no such limitation is fundamental to the present invention. That is, even for two-dimensional arrays, $4 \times 4$ or other size arrays may prove advantageous in particular cases. Likewise, though the codebook shown has 36 vectors, conveniently indexed as 1 through 6 for the first row through 31 through 36 for the last row, the number of vectors used is not critical to the present invention. Particular numbers of vectors will be selected as the application may dictate. When the structure of the input multi-level (e.g., video) signals is highly structured, the vectors may be accordingly structured and, where appropriate, limited to a greater or larger number.

It is important to note, however, that the vectors can be selected without the need for prior training, or retraining while in use. That is, the vectors can be selected prior to use with any data, whether based on observed structure of the signals or otherwise. This should be contrasted with vector quantization techniques described, e.g., in Y. Linde, A. Buzo, and R. M. Gray, "An Algorithm For Vector Quantizer Design," *IEEE Transactions on Communications*, COM-28, pp. 84–95, January 1980.

In operation, the surviving sub-band signals (after thresholding) appearing on inputs 160 to the geometrical vector quantizer 150 in FIG. 1 are compared systematically with the vectors stored in codebook 160. Multi-level signals from each sub-band (representing video amplitudes in the application under consideration) are presented one sub-band at a time.

Part of the processing of input multi-level signals and stored vectors in accordance with the present invention includes assigning magnitudes to the two-valued areas of the vectors of FIG. 5. For illustrative purposes, the code vectors of FIG. 5 are shown as having elements of two magnitudes, one associated with the non-cross-hatched areas such as 51 in typical vector with index 4 in FIG. 5, and another with the cross-hatched areas indicated as 52 in that vector. (It should be noted that the area 51, for the vector with index number 4, corresponds to three vertically arranged pixels in the current application, while the area 52 corresponds to the two vertical rows of pixels, with each such row having three pixels).

The magnitudes assigned to these elements (pixels, here) is based on the magnitudes for the pixels in a corresponding current $3 \times 3$ area in the image for a particular sub-band. More particularly, the magnitudes for the area 51 and 52 in a particular vector, e.g., that with index 4, are formed by computing $$M_1 = \frac{1}{3} \sum_{i=1}^{1} \sum_{j=1}^{3} x_{i,j}$$

$$M_2 = \frac{1}{6} \sum_{i=2}^{3} \sum_{j=1}^{3} x_{i,j}$$

for each set of 3×3 input multilevel signals which together cover the entire frame for one sub-band. The exact ranges for the summations are, of course, dictated by the structure of the particular vector. The ranges for $M_1$ are conveniently associated with area 51 (unshaded area) in the vectors of FIG. 5, and $M_2$ is associated with the shaded areas 52 of the vectors of FIG. 5. It will be noted that $M_1$ and $M_2$ are the average intensities of the multi-level signals (pixels) in the respective areas 51 and 52 corresponding to vector 4. This will be time for other vectors having different particular areas 51 and 52. It should be noted, however, that this averaging merely provides a magnitude representative of the pixel intensities associated with the area corresponding to the code book vector areas. Other particular representative values, e.g., maximum values for an area, can be used in appropriate cases.

It proves convenient to refer to the input 3×3 set as an array $b_1$ and the current vector, with the magnitude calculated above the respective elements as $\hat{b}_1$.

The comparison for a particular 3×3 area in the input is, of course, compared with all of the vectors in the codebook and a corresponding set of $\hat{b}_1$ arrays computed for each. An error metric, conveniently the mean square error metric $$e = \frac{1}{9} \sum_{i=1}^{3} \sum_{j=1}^{3} (\hat{b}_1 - b_1)^2 \qquad (4)$$

is computed for each $b_1$ and $\hat{b}_1$, and the vector corresponding to the smallest error is selected as the best match. The subtraction in Eq. 4 is, of course, a matrix subtraction with the indicated i and j values identifying the rows and columns, respectively.

As noted, this comparison is performed, for the present illustrative application, for all 3×3 arrays in each of the relevant higher-order sub-bands, i.e., 2, 3, 4 and 8 for the example mentioned above.

For each vector selected as being the best match, the vector index (after Huffman coding as described below) is conveniently sent, along with the magnitudes $M_1$ and $M_2$ to multiplexer 190 in FIG. 1, where this information is combined with the DPCM information from DPCM coder 170.

To further reduce the amount of information required to code an input set of multi-level signals, such as the video information currently under discussion, it proves convenient to further process the index and magnitude information prior to the multiplexing operation. This reduction is possible because it often occurs that a null vector having only a single magnitude may occur with considerable frequency. Thus in video information, the background in some spatial sub-bands, and much motion content (i.e., temporal components) will not contribute significant information much of the time. In such cases, a "null vector", such as the vector having index 21 in FIG. 5 will be selected with high frequency.

Moreover, the magnitudes $M_1$ and $M_2$ may differ little in many occurrences. Thus it proves convenient to send the same null vector when the magnitudes vary by less than some preselected threshold. More particularly, if $|M_1 - M_2| >$ a threshold, then the vector selected by the normal comparison is sent, while if $|M_1 - M_2| \leq$ this threshold, only the null character is sent along with one of the magnitudes which differs by less than the threshold value. (It may prove convenient to select magnitude equal to the average, or some other representative value, of the two nearly equal magnitudes in such cases.)

For the above indicated magnitude variations for the input multi-level signals, it proves convenient to select a threshold value of 5, through other particular values may be chosen to fit bit rate and amplitude variation constraints.

Since the null vector will occur with relatively great frequency, it is of great advantage to code its index with a small number of bits. For this purpose the well-known Huffman coding techniques prove useful. This operation is shown in FIG. 1 by the block 180. The details of implementation of Huffman coding are described extensively in the art, e.g., the Jayant and Null book, supra. Other particular non-uniform code length techniques, also well-known in the art can be used in particular cases.

FIG. 2 shows a decoder counterpart to the coder of FIG. 1. Coded signals received from the channel 195 are first demultiplexed in unit 200 in reciprocal fashion to multiplexer 190 in FIG. 1 to separate the DPCM-encoded sub-band 1 information and the vector quantized information for the higher sub-bands. Huffman decoder 210, well-known in the art, performs the decoding of the vector indexes and provides these indexes and corresponding magnitude information to the vector quantizer decoder 230. This latter unit operates in standard fashion to identify the vectors to be selected from codebook 220 for application to the sub-band synthesis unit 250 of the form known in the art to reverse the operation of filter 110 of FIG. 1. The output of the synthesis unit 250 is the reconstructed frame information initially supplied to the circuit of FIG. 1.

While the above description has proceeded in terms of a multi-level gray scale input signal, it should be apparent that a suitable combination of color component signals can either be processed individually as described above, or can be even more efficiently processed by using color component combining techniques well-known in the art prior to applying the teachings of the present invention.

Likewise, through only two magnitudes have been described in connection with the illustrative codebook of FIG. 5, it is clear that the teachings of the present invention can be readily applied to codebooks with more than two magnitudes for the elements of the vectors.

We claim:

1. A method of coding a set of multi-level signals comprising exhaustively comparing said set with each of a plurality of vectors to determine a set of difference metrics, each of said vectors including a geometric array of one or more elements, each of said elements having a respective magnitude, said metrics reflecting the geometry of said elements in the array and at least two of said plurality of magnitudes, selecting the vector which minimizes said difference metric, and generating (i) a coded representation of said selected vector whenever the differences between respective pairs of said magnitudes exceed corresponding threshold values, or (ii) a null coded representation whenever the differences between respective pairs of said magnitudes does not exceed said threshold value.

2. The method of claim 1, wherein said geometric array comprises a linear array of elements.

3. The method of claim 2, wherein said multi-level signals represent at least a portion of a multi-dimensional signal, and wherein said geometric array comprises a two-dimensional array of elements.

4. The method of claim 3, wherein said elements have one of two magnitudes.

5. The method of claim 4, wherein for each of said vectors said magnitudes are representative values for the intensity of respective portions of said at least a part of said multi-dimensional signal.

6. The method of claim 5, wherein said at least a portion of said multi-dimensional signal comprises a two-dimensional array of signal elements and said two magnitudes represent the average values of the intensity for two respective mutually exclusive covering subsets of said signal elements.

7. The method of claim 6, wherein one of said subsets includes a substantially linear array of signal elements disposed in a first direction.

8. The method of claims 6 or 7, wherein said multi-dimensional signal represents a visual image and wherein said signal elements represent pixels.

9. The method of claim 1, wherein said coded representation of said selected vector includes an index identifying said vector and said plurality of magnitudes, and wherein said null coded representation includes an index identifying said null vector and a single magnitude.

10. The method of claim 6, wherein said at least a portion of said multidimensional signal comprises a sub-band of a spatial-temporal sub-band filtering of a visual image.

11. The method of claims 1 or 9, wherein said step of generating coded representations comprises representing frequently selected vectors with relatively fewer bits than vectors selected less frequently.

12. The method of claims 1 or 9, wherein said step of generating coded representations comprises using a Huffman coding to represent selected code vectors.

13. A method of coding a set of multi-level signals, wherein said multi-level signals represent one or more of the sub-bands for a spatial-temporal-sub-band filtered visual image, the method comprising exhaustively comparing said set with each of a plurality of vectors to determine a set of difference metrics, each of said vectors including a geometric two-dimensional array of one or more elements, each of said elements having a respective magnitude, said metrics reflecting at least two of said plurality of magnitudes, selecting the vector which minimizes said difference metric, and generating (i) a coded representation of said selected vector whenever the differences between respective pairs of said magnitudes exceed corresponding threshold values, or (ii) a null coded representation whenever the differences between respective pairs of said magnitudes does not exceed said threshold value.

14. The method of claim 13, further comprising the step of eliminating any signals corresponding to sub-bands having less than a preselected threshold amount of energy.

* * * * *